United States Patent
Cui

(10) Patent No.: US 8,050,416 B2
(45) Date of Patent: Nov. 1, 2011

(54) SOUND CHANNEL DETECTION CIRCUIT

(75) Inventor: Zhen-Shan Cui, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 894 days.

(21) Appl. No.: 12/052,749

(22) Filed: Mar. 21, 2008

(65) Prior Publication Data

US 2009/0190768 A1  Jul. 30, 2009

(30) Foreign Application Priority Data

Jan. 29, 2008  (CN) .......................... 2008 1 0300251

(51) Int. Cl.
*H04R 29/00* (2006.01)

(52) U.S. Cl. ............... 381/58; 381/59; 381/77; 381/306

(58) Field of Classification Search ........................ None
See application file for complete search history.

(56) References Cited

U.S. PATENT DOCUMENTS 6,370,252 B1 * 4/2002 Lunter ............................ 381/58
2009/0086985 A1 * 4/2009 Zhang et al. .................... 381/58

FOREIGN PATENT DOCUMENTS

CN  85108672  7/1986

* cited by examiner

*Primary Examiner* — Minh-Loan T Tran
(74) *Attorney, Agent, or Firm* — Altis Law Group, Inc.

(57) ABSTRACT

A sound channel detection circuit includes a amplifier circuit and a LED. The amplifier circuit has an input connected to a connector for receiving an AC voltage signal and an output. The LED has an anode connected to the output of the amplifier circuit and a cathode connected to ground, when a sound channel circuit to be tested works normally, the AC voltage is amplified by the amplifier circuit and drives the LED to flash, when the sound channel circuit to be tested is not working, the LED doesn't emit light. The sound channel detection circuit with the amplifier circuit and the LED can improve the accuracy and efficiency of detection in a situation of a batch production in a noisy environment.

10 Claims, 1 Drawing Sheet

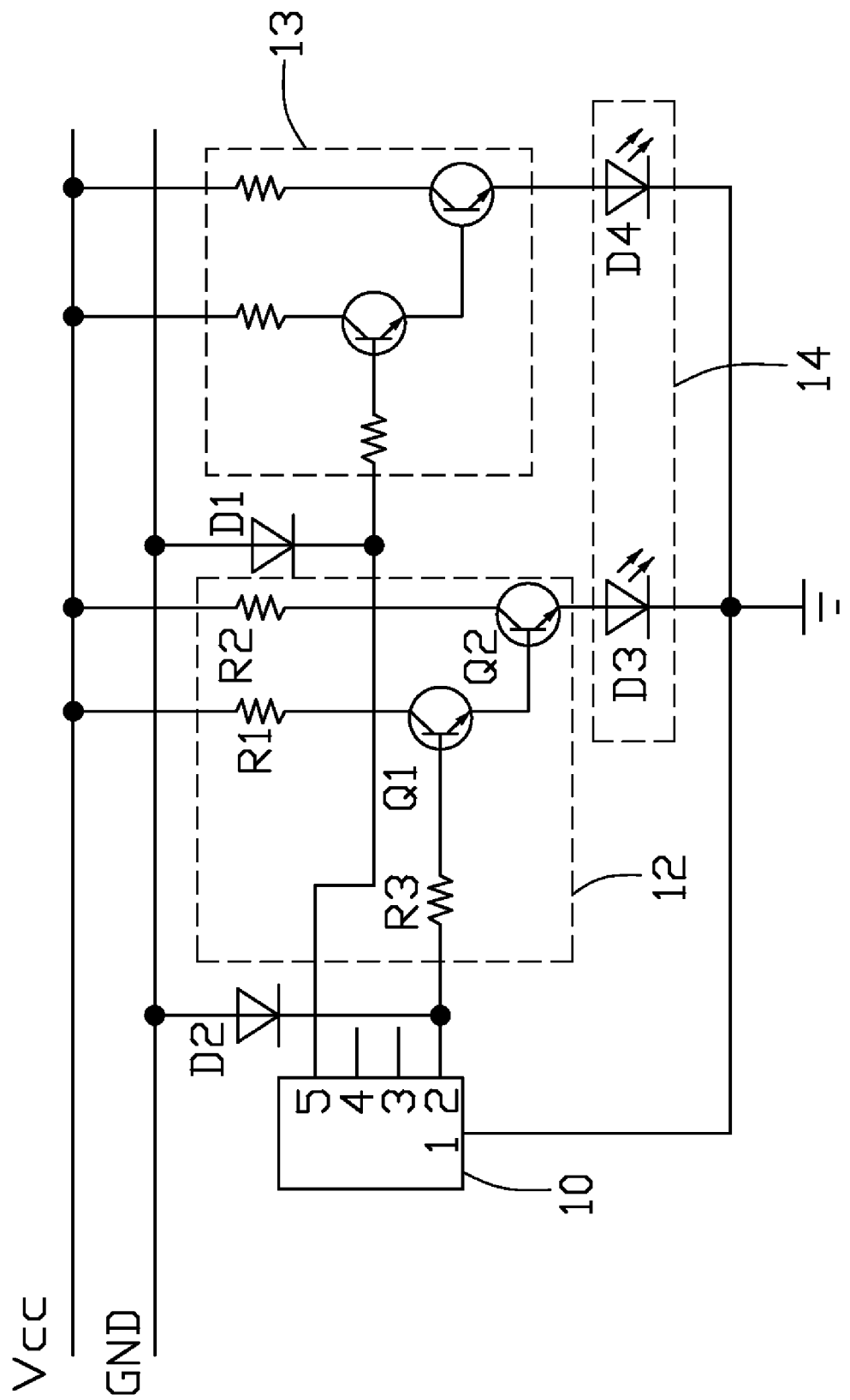

SOUND CHANNEL DETECTION CIRCUIT

BACKGROUND

1. Field of the Invention

The present invention relates to sound channel detection circuits, and particularly to an earphone sound channel detection circuit.

2. Description of related art

A sound channel circuit of an earphone in a computer includes capacitors connected in series. In production of the computer, the sound channel circuit should be checked for normal operation. A sound signal is sent to the sound channel circuit and then a tester checks whether a corresponding sound produced by an earphone. If the tester can hear the sound, the sound channel circuit works normally.

However, because the computers are produced in large batches in a noisy environment, it can be difficult for the tester to hear the sound.

What is needed, therefore, is an earphone sound channel detection circuit which can solve the above problems.

SUMMARY

An exemplary sound channel detection circuit includes a sound channel amplifier circuit and a light emitting diode (LED). The sound channel amplifier circuit has an input connected to a sound channel circuit to be tested for receiving an AC voltage signal and an output. The LED has an anode connected to the output of the sound channel amplifier circuit and a cathode connected to ground, wherein when the sound channel circuit to be tested works normally, the AC voltage is amplified by the sound channel amplifier circuit and drives the LED to flash, when the sound channel circuit to be tested doesn't work, the LED doesn't emit light.

Other advantages and novel features of the present invention will become more apparent from the following detailed description of an embodiment when taken in conjunction with the accompanying drawings, in which:

BRIEF DESCRIPTION OF THE DRAWINGS

The drawing is a circuit diagram of a sound channel detection circuit in accordance with an exemplary embodiment.

DETAILED DESCRIPTION

Referring to the drawing, a sound channel detection circuit in accordance with an exemplary embodiment includes a connector 10, two sound channel amplifier circuits 12,13, a display circuit 14, and two diodes D1,D2. The connector 10 is adapted for plugging into an earphone port in a computer. The connector 10 includes five pins 1,2,3,4,5. The pin 1 is a ground pin, the pins 3 and 4 are input pins, the pins 2 and 5 are a left and a right sound channel output pin respectively. The pins 3 and 4 are connected to left and right sound channel circuits to be tested respectively. The pins 2 and 5 are connected to the sound channel amplifier circuits 12 and 13 respectively.

The sound channel amplifier circuits 12 and 13 have a same structure. The sound channel amplifier circuit 12 is herein disclosed as an example. The sound channel amplifier circuit 12 includes two transistors Q1, Q2 and three resistors R1, R2, R3. The transistors Q1 and Q2 are NPN transistors. The base of the transistor Q1 acts as an input terminal of the sound channel amplifier circuit 12 and is connected to a terminal of the resistor R3. The other terminal of the resistor R3 is connected to the pin 2 of the connector 10 and the cathode of the diode D2. The anode of the diode D2 is grounded. The collectors of the transistors Q1 and Q2 are connected to a DC power source Vcc through the resistors R1 and R2 respectively. The emitter of the transistor Q1 is connected to the base of the transistor Q2. The emitter of the transistor Q2 acts as an output terminal of the sound channel amplifier circuit 12. An input terminal of the sound channel amplifier circuit 13 is connected to the pin 5 of the connector 10 and the cathode of the diode D1. The anode of the diode D1 is connected to ground.

The display circuit 14 includes two light emitting diodes (LEDs) D3 and D4. The anodes of the LEDs D3 and D4 acting as input terminals of the display circuit 14 are connected to the sound channel amplifier circuits 12 and 13 respectively. Both the cathodes of LEDs D3 and D4 are connected to ground.

In use, the connector 10 is plugged into the earphone port of the computer. A sine wave signal is transmitted to the sound channel circuit to be tested. If the sound channel circuit to be tested works normally, the sine wave signal is received by the connector 10 and is sent to the sound channel amplifier circuits 12 and 13. When the sine wave signal is positive, both the transistors Q1 and Q2 turn on. The emitter of the transistor Q2 outputs an amplified direct current voltage to drive the LED D3 to emit light. When the sine wave signal is negative, both the transistors Q1 and Q2 turn off. The LED D3 doesn't emit light. Therefore, when the sine wave signal is continuously input to the sound channel circuit to be tested, the LED D3 flashes to indicate the sound channel circuit to be tested is normal. If the sound channel circuit to be tested is not working, the connector 10 doesn't receive the sine wave, and the LED D3 doesn't emit light.

In another embodiment, both the sound channel amplifier circuits 12 and 13 include only one transistor. The sound channel amplifier circuit 12 used as an example is described. The sound channel amplifier circuit 12 includes the transistor Q1. The connections between the transistor Q1 and the resistors R1, R3 are the same as shown in the drawing. What is different, is that the emitter of the transistor Q1 acting as the output terminal of the sound channel amplifier circuit 12 is connected to the anode of the LED D3. Other operations of the sound channel detecting circuit of this embodiment are the same as in the previous embodiment.

The foregoing description of the exemplary embodiments of the invention has been presented only for the purposes of illustration and description and is not intended to be exhaustive or to limit the invention to the precise forms disclosed. Many modifications and variations are possible in light of the above teaching. The embodiments were chosen and described in order to explain the principles of the invention and their practical application so as to enable others skilled in the art to utilize the invention and various embodiments and with various modifications as are suited to the particular use contemplated. Alternately embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A sound channel detection circuit comprising:
a connector adapted for plugging into an earphone port for receiving a sound signal therefrom;

an amplifier circuit comprising a control input connected to the connector to receive the sound signal as a control signal, a power input connected to a power source, and an output; and a light emitting diode (LED), the anode of the LED connected to the output of the amplifier circuit, and the cathode of the LED connected to ground, the control signal controlling turning on or off of the LED.

2. The sound channel detection circuit as claimed in claim 1, wherein the amplifier circuit comprises first and second transistors, the base of the first transistor acts as the control input of the amplifier circuit, the collectors of the first and second transistors act as the power input, the emitter of the first transistor is connected to the base of the second transistor, and the emitter of the second transistor acts as the output of the amplifier circuit.

3. The sound channel detection circuit as claimed in claim 2, further comprising a diode, wherein the cathode of the diode is connected to the base of the first transistor, and the anode of the diode is connected to ground.

4. The sound channel detection circuit as claimed in claim 2, wherein the amplifier circuit comprises a resistor connected between the base of the first transistor and the connector.

5. The sound channel detection circuit as claimed in claim 2, wherein the amplifier circuit comprises a resistor connected between the collector of the first transistor and the power source.

6. The sound channel detection circuit as claimed in claim 2, wherein the amplifier circuit comprises a resistor connected between the collector of the second transistor and the power source.

7. The sound channel detection circuit of claim 1, wherein the connector comprises a left sound channel pin and a right sound channel pin, the control input of the amplifier circuit is connected to one of the left and right sound channel pins, another amplifier circuit and another LED are so arranged to the other one of the left and right sound channel pins.

8. The sound channel detection circuit as claimed in claim 1, wherein the amplifier circuit comprises a transistor having a base acting as the control input of the amplifier circuit connected to the connector, a collector acting as the power input connected to the power source, and an emitter acting as the output of the amplifier circuit.

9. The sound channel detection circuit as claimed in claim 8, wherein the amplifier circuit comprises a resistor connected between the base of the transistor and the connector.

10. The sound channel detection circuit as claimed in claim 8, wherein the amplifier circuit comprises a resistor connected between the collector of the transistor and the power source.

\* \* \* \* \*